United States Patent
Gorelik (12)

(10) Patent No.: US 6,221,739 B1
(45) Date of Patent: Apr. 24, 2001

(54) METHOD FOR BONDING SINGLE CRYSTAL MEMBRANES TO A CURVED SURFACE

(76) Inventor: Vladimir A. Gorelik, 7003 Sand Rd., Wilmington Island, GA (US) 31410

( * ) Notice: Subject to any disclaimer, the term of this patent is extended or adjusted under 35 U.S.C. 154(b) by 0 days.

(21) Appl. No.: 09/195,169

(22) Filed: Nov. 17, 1998

Related U.S. Application Data (60) Provisional application No. 60/097,240, filed on Aug. 20, 1998.

(51) Int. Cl.$^7$ .................................................. H01L 21/58
(52) U.S. Cl. ........................ 438/455; 438/457; 438/938; 438/962
(58) Field of Search ................................ 438/25, 26, 29, 438/33, 39, 55, 64, 68, 107, 118, 119, 457, 455, 456, FOR 369, FOR 409, 458, 938, 962; 148/DIG. 12

(56) References Cited

U.S. PATENT DOCUMENTS

| | | | |
|---|---|---|---|
| 3,441,742 | 4/1969 | Bevis | 250/239 |
| 3,562,582 | 2/1971 | Broyles | 315/153 |
| 3,683,296 | 8/1972 | Scalise | 331/94.5 |
| 3,711,789 | 1/1973 | Dierschke | 331/94.5 |
| 3,875,404 | 4/1975 | Fletcher et al. | 250/211 |
| 4,063,083 | 12/1977 | Cathey et al. | 250/199 |
| 4,499,607 | 2/1985 | Higgins | 455/606 |
| 4,499,608 | 2/1985 | Broockman et al. | 455/607 |
| 4,551,787 | 11/1985 | Mittal et al. | 361/387 |
| 4,564,866 | 1/1986 | Comberg | 358/302 |
| 4,590,538 | 5/1986 | Cray, Jr. | 361/385 |
| 4,662,714 | 5/1987 | Mori | 350/96.2 |
| 4,682,323 | 7/1987 | Corfield et al. | 370/4 |
| 4,755,681 | 7/1988 | Oka et al. | 250/370.01 |
| 4,838,630 | 6/1989 | Jannson et al. | 350/3.7 |
| 4,841,355 | 6/1989 | Parks | 357/82 |
| 4,850,044 | 7/1989 | Block et al. | 455/607 |
| 4,851,856 | 7/1989 | Altoz | 343/720 |
| 4,893,025 | 1/1990 | Lee | 250/561 |
| 5,067,792 | 11/1991 | Lloyd | 359/32 |
| 5,111,280 | 5/1992 | Iversen | 357/82 |
| 5,113,403 | 5/1992 | Block et al. | 359/152 |
| 5,113,404 | 5/1992 | Gaebe et al. | 372/36 |
| 5,238,531 | 8/1993 | Macomber et al. | 156/643 |
| 5,361,272 | 11/1994 | Gorelik | 372/50 |
| 5,546,417 | 8/1996 | Gorelik | 372/36 |

FOREIGN PATENT DOCUMENTS

| | | | |
|---|---|---|---|
| 0176288 | 9/1985 | (JP) | 372/50 |
| 1-293589 | 11/1989 | (JP) | H01S/3/18 |

OTHER PUBLICATIONS

Scifres et al., "Semiconductor Laser with Integral Light Intensity Detector", Appl. Phys. Lett 35(1) Jul. 1, 1979, pp. 16–18.

*Primary Examiner*—George Fourson
*Assistant Examiner*—Thanh V Pham
(74) *Attorney, Agent, or Firm*—Thomas, Kayden, Horstemeyer & Risley (57) ABSTRACT

In accordance with the present invention, a preferred method for bonding a single crystal membrane to a supporting structure having a curved surface includes the steps of segmenting a unitary wafer of a single crystal, for example semiconductor material, into a plurality of semi-attached wafer segments and then aligning a supporting structure with each of the wafer segments. The wafer segments are then detached from each other and are individually bonded to one of the supporting structures. In the case of silicon, lattice strain each of the segments is relieved by depositing a layer of germanium onto the surface of the silicon membrane and then thermally processing the assembly so that germanium atoms are either nucleate on the surface to form quantum wires or diffused into the lattice to relieve the lattice strain.

20 Claims, 6 Drawing Sheets

METHOD FOR BONDING SINGLE CRYSTAL MEMBRANES TO A CURVED SURFACE

CROSS-REFERENCE TO RELATED APPLICATIONS

This application is based on and claims priority to U.S. Provisional Application Serial Number 60/097,240, filed on Aug. 20, 1998, which is herein incorporated by reference.

STATEMENT REGARDING FEDERALLY SPONSORED RESEARCH OR DEVELOPMENT

Not applicable.

BACKGROUND OF THE INVENTION

1. Field of the Invention

The present invention generally relates to the fabrication of non-planar semiconductors, and more particularly to a method for bonding single crystal membranes to a curved surface and relieving the lattice stress in the membranes due to formation of quantum wires of a dissimilar element.

1. Discussion of Related Art

In the microelectronic industry, integrated circuitry is typically fabricated on the surface of a flat single-crystal silicon wafer, generally known as a substrate, for use in microelectronic devices. Quality and characteristics of these microelectronic devices are altered by quality and characteristics of the substrate. In particular, material purity, dislocation density, and level of lattice strain effect the behavior and performance of these devices. Additionally, the introduction of well controlled strain facilitates band-gap engineering and has led to the development of new devices, such as SiGe heterojunction bipolar transistors (HBT's), among others. Another trend in device engineering is associated with developing technology capable of producing low-dimensional structures, such as quantum wells, quantum wires and quantum dots.

Process induced lattice stress (as a result of oxidation, doping, ion implantation, silicidation, etc.) combined with the intrinsic silicon wafer dislocation density may significantly degrade device performance reliability. U.S. Pat. No. 4,769,689 discloses relieving the stress and resultant warping caused by lattice mismatch by doping germanium on an initial silicon crystal layer which consequently maintains the wafer in a flat configuration.

U.S. Pat. No. 5,546,417 discloses a basic semiconductor element having electronic circuitry fabricated on the surface of a non-planar substrate. The required non-planar nature of the basic semiconductor element assembly creates difficulties when integrating the silicon membrane with the non-planar supporting structure because stress may occur within the silicon lattice if the surface area of the supporting structure is a cylinder or cone having a small radius of curvature.

Furthermore, a high quality bond between the semiconductor material and the supporting structure is required. However, a problem arises while attempting to bond a flat silicon membrane to a non-planar supporting structure which has a small radius of curvature due to stress build-up within the membrane followed by lattice relaxation and resultant nucleation of dislocations. Such behavior prevents production of a semiconductor material having a sufficiently high quality for use in certain applications. Another challenge is in achieving a high quality bond between the supporting structure and a single crystal membrane.

Accordingly, it is an object of the present invention to provide a method of fabricating a substrate for a basic semiconductor element which overcomes these and other shortcomings in the prior art.

BRIEF SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a method of fabricating single crystalline substrates conformed to supporting non-planar structures. The method can be implemented for conforming many classes of single crystalline materials (i.e. semiconducting, optical, magnetic, etc.) available in membrane form, to cylindrical or conical surfaces. In accordance with one aspect of the present invention, the method includes providing a thin semiconductor membrane and a non-planar supporting structure. The semiconductor membrane has a generally flat profile and comprises a single crystalline material. A semiconducting material having a different lattice constant but the same valence as the material of the membrane (e.g. an element from the same group of the Periodic Table or isovalent) is deposited onto the single crystal semiconducting membrane. The semiconducting membrane is positioned onto the non-planar supporting structure. The atoms of this isovalent element are incorporated into the crystal lattice of the host semiconducting membrane along the lines of maximum lattice strain. This enables the semiconducting membrane to bend and conform to the non-planar surface of the supporting structure, thereby relieving the lattice stress which, otherwise, would be present as a result of bending the membrane.

In accordance with one aspect of the present invention, after relieving the lattice strain by nucleation of isovalent material in the locations characterized by the largest strain, the bent semiconducting membrane is fused with the material of a supporting structure to form a substrate for the basic semiconductor element.

In accordance with another aspect of the present invention, the membrane containing the regular spaced lines of the isovalent material can be released from the support to form the flat wafer with equally spaced quantum wires.

In accordance with another aspect of the present invention, the method includes segmenting a unitary wafer of semiconductor material into a plurality of semi-attached wafer segments with each of the semi-attached wafer segments connected by a wafer bridge to an adjacent semi-attached wafer segment. A supporting structure is aligned with each of the semi-attached wafer segments and then the wafer segments are detached from each other by severing each of the wafer bridges. Each of the detached wafer segments are then bonded to one of the supporting structures, thereby forming a semiconductor element assembly.

BRIEF DESCRIPTION OF THE SEVERAL VIEWS OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE INVENTION

Having summarized various aspects of the present invention, reference will now be made in detail to the description of the invention as illustrated in the drawings. While the invention will be described in connection with these drawings, there is no intent to limit it to the embodiment or embodiments disclosed herein. On the contrary, the intent is to cover all alternatives, modifications and equivalents included within the spirit and scope of the invention as defined by the appended claims.

In general, the method of integrating a thin silicon membrane with a non-planar supporting structure to form a substrate for a basic semiconductor element and creating an array of quantum wires in it includes numerous steps depending on the configuration of the supporting structure and the desired bond integrity, if a particular bond integrity is required.

If the non-planar supporting structure to which segments of the membrane will be attached or conformed to has a small radius of curvature and the membrane has a sufficient thickness, stress may be incurred within the crystal lattice of the membrane during membrane bending. When the stress exceeds a certain threshold, lattice relaxation occurs by dislocation introduction. Under some conditions, i.e. conditions suitable for obtaining the desired device behavior, controllable lattice stress is welcomed; however, dislocations must be avoided.

In order to control the level of stress in the silicon membrane while bending, a second semiconducting material (e.g a material having a different lattice parameter and which is located in the same group of the Periodic Table, or an alloy containing such a material) can be deposited on the top surface of the flat single-crystal silicon membrane in the form of an Ultrathin™ membrane. In the case of a silicon membrane, the second material can be, for example, germanium, carbon, silicon-germanium, a silicon-carbide alloy, etc. To relax the lattice stress introduced in the external layer of the silicon membrane during bending, the ultra-thin membrane of second material provides, for example, germanium atoms, which are substituted for silicon atoms in the crystal lattice of the silicon membrane. Since germanium has larger lattice constant, its atoms occupy more space and will force the silicon membrane to bend naturally around a non-planar surface if they are located primarily in the external layer of the membrane. This is because an unstressed silicon lattice does not provide enough space to accommodate incorporation of the larger germanium atoms, and hence, incorporation of the germanium atoms will force the thin silicon membrane to bend naturally.

Another mechanism is envisioned for ad-atoms surface kinetics during epitaxial growth on the surface of a bent single-crystal lattice. Stretching the interatomic spacing along the main crystallographic axis will increase the surface energy of the material. The epitaxial growth process will tend to reduce this energy by 'anchoring' ad-atoms predominantly in the area with the maximum surface energy, and therefore, relieve this energy. Under these conditions, ad-atoms will tend to organize themselves into quantum wires along the direction perpendicular to the direction of maximum stress.

In accordance with a preferred method of the present invention, the first step involves preparation of a silicon membrane for conforming to a non-planar supporting structure. Preparation of the silicon membrane can include the deposition of a dissimilar semiconducting element from the same group of the Periodic Table (the same valence) but having a different lattice constant. This element will be diffused into the underlying lattice or will form an alloy with the silicon on the surface of the membrane having variable concentrations along two predominant crystallographic orientations to provide stress relief, if stress relief is required. The required concentration of this dissimilar material depends upon the desired amount of lattice strain, radius of curvature of the supporting structure, and thickness of the silicon membrane. Under controlled conditions, while bending and conforming a silicon membrane having several germanium monolayers formed thereon, stress relief is obtained by formation of germanium quantum wires. The directions and densities of these wires are defined by the direction and the level of strain in the silicon membrane.

The second step of the preferred embodiment, which, if required, can be combined with the stress relieving process of step one, involves fusing the silicon membrane with the non-planar surface of the supporting structure. During fusing, a layer of polysilicon is deposited on the top of the single-crystal silicon membrane which is attached to a cone or cylinder-shaped supporting structure. As a result of volumetric expansion during the oxidation of the polysilicon layer, a pressure is evenly exerted onto the underlying single crystal silicon membrane. This force is directed normally to the surfaces of the membrane and supporting structure, thereby benefiting the bonding. When the supporting structure is fabricated from quartz, fusion between the silicon membrane and the supporting structure also benefits due to the presence of oxygen trapped in the voids between the membrane and the supporting structure. This oxygen is consumed during membrane oxidation and forms a silicon oxide which fills up the voids, thereby improving the bond. The fusing step also can include the step of preparing the non-planar supporting structure with additional deposition layers of polysilicon prior to integrating the supporting structure with the silicon membrane.

Figure 1:
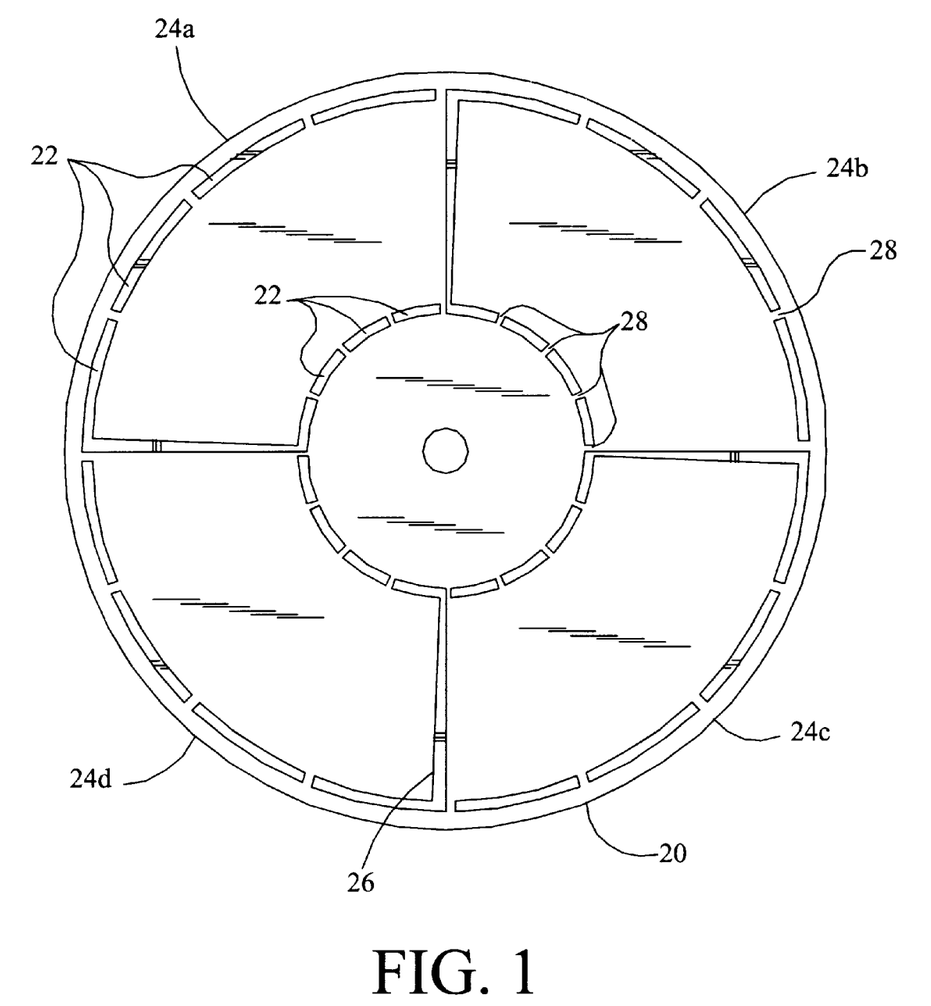
FIG. 1 illustrates the segmenting of a single crystalline semiconductor membrane into a plurality of segments according to a preferred embodiment of the present invention.

FIG. 1 illustrates the details of preparation of a circular single-crystal silicon membrane 20 for integration with four cone-shaped supporting structures. Integration with a supporting structure will be described herein in relation to cone-shaped supporting structures for ease of description, however, integration with cylinder-shaped supporting structures can be accomplished based on the following description by one of ordinary skill in the art without undue experimentation. For instance, when a cylinder-shaped supporting structure is to be integrated, a rectangular sheet or an entire silicon membrane can be utilized. Membrane 20 can be patterned on the surface of either a standard silicon wafer, on the surface of an Ultrathin™ silicon membrane, etc.

Figure 2:
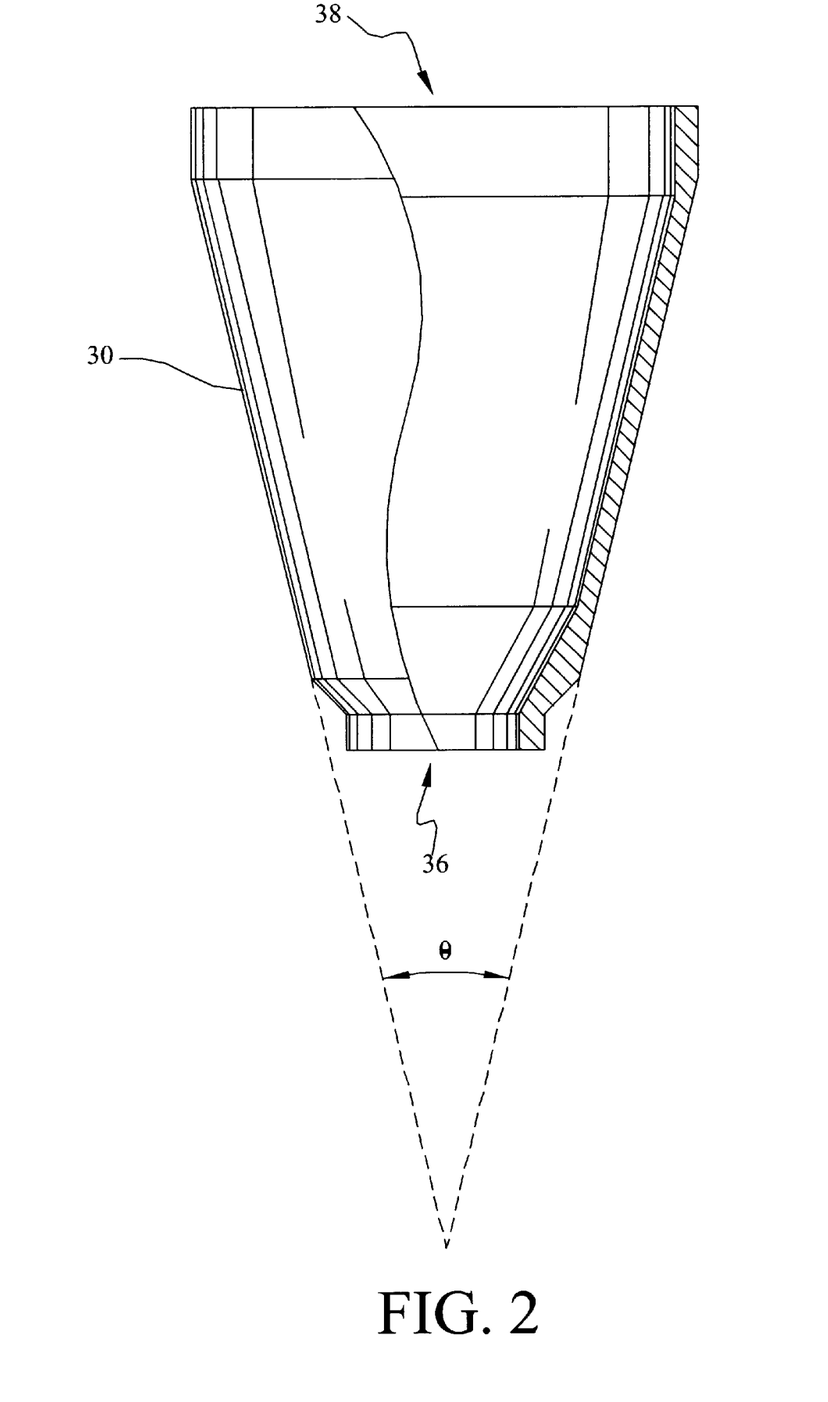
FIG. 2 illustrates a conical supporting structure according to a preferred embodiment of the present invention.

FIG. 2 illustrates a cone-shaped supporting structure 30 for integration (a cylinder-shaped structure may be preferred for some applications). The surface area of a cone-shaped supporting structure with an included angle (θ) at it s apex of less than thirty degrees (30°) can be developed into conic sectors, with each sector including less than ninety degrees (90°) of arc. So configured, each membrane 20 has a large enough surface area for wrapping up to four cone-shaped supporting structures (e.g. each conic membrane sector for wrapping each supporting structure). All these dimensions are given for the purpose of explanation, any other arbitrary dimensions can be used without limiting the scope and subject of the invention.

As shown in FIG. 1, the preparation process begins with patterning trenches 22 on the surface of the membrane 20. The depth of these trenches can be equal to or greater than the desirable final thickness of the membrane 20. Trenches 22 separate four segments 24a, 24b, 24c and 24d of the patterned and finished membrane 20 from each other, thus providing each segment with a free end 26. Bridges 28 formed between the trenches 22 help maintain the integrity of the membrane prior and during spooling by providing support to segments 24a, 24b, 24c and 24d.

After trenches are patterned and etched down to a desirable depth, membrane back- side lapping, etching and polishing is carried out to remove any excessive material. As a result of this material removal process, the four segments of the segmented silicon membrane are almost separated from each other. Additionally, the presence of these trenches simplifies membrane thickness control during lapping.

A very thin film incorporating a few monolayers of germanium atoms can be deposited on the surface of the segmented membrane 20 in such a way that no germanium atoms intermix with the membrane, and therefore, no formation of an SiGe alloy occurs (it has been shown that no intermixing between silicon and germanium will occur below four hundred and forty degrees centigrade (440° C.)). Germanium deposition can be carried out by any known low temperature sputtering technique, and can be performed before the membrane is etched from the back side during the preparation of the segmented silicon membrane or after obtaining a thin silicon membrane. After depositing the germanium layer (if required), trenches 22 are patterned and etched and the silicon membrane is thinned down to a thickness equal to the depth of these trenches. If germanium has been deposited on the surface of the membrane prior to bending, it is desirable to allow the germanium atoms to move into their final location in the lattice only during or after integration of the membrane with the supporting structure. In this case, germanium will prefer to settle in the lattice locations where the maximum strain exists, thereby relieving this strain.

Figure 3:
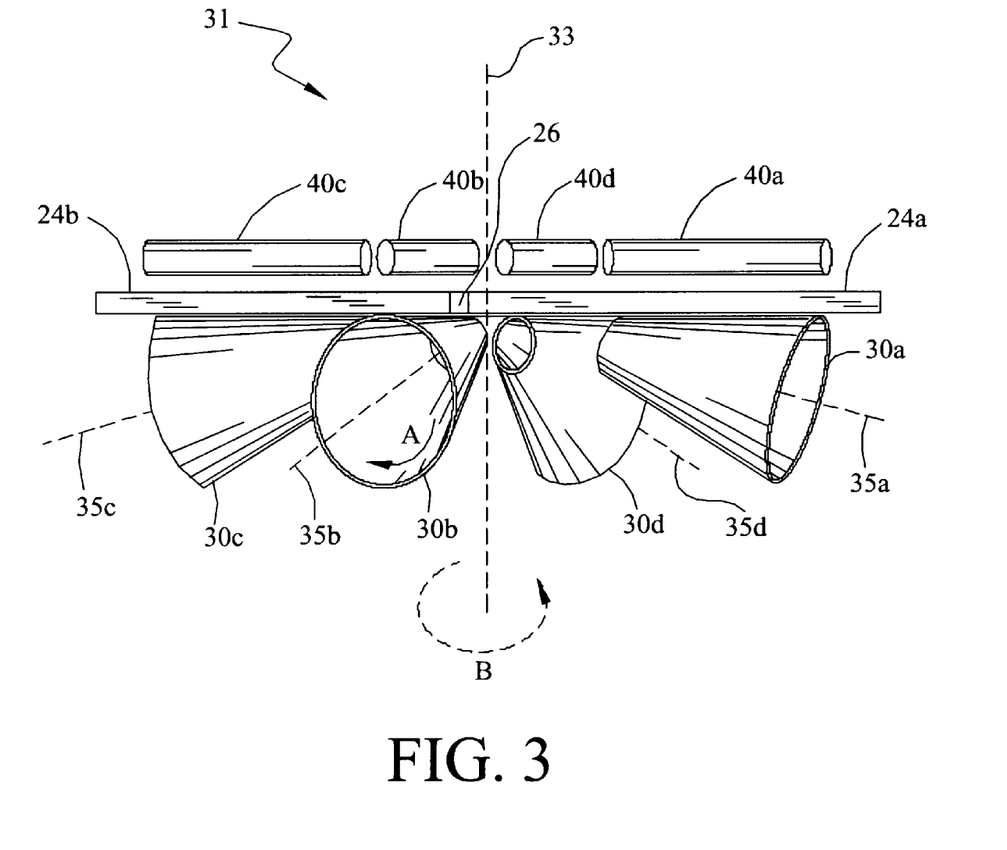
FIG. 3 illustrates a perspective view of a representative apparatus for attaching multiple segments of a membrane to a plurality of supporting structures according to a preferred embodiment of the present invention.

As shown in FIG. 3, after silicon membrane 20 with segments 24a, 24b, 24c and 24d is prepared (with or without germanium film), the segments are integrated with respective supporting structures 30. Accordingly, these four segments will generally be simultaneously integrated with the exterior surface of four hollow cone-shaped supporting structures 30 made from pure quartz, although other materials, dimensions, and shapes can be utilized.

FIG. 3 depicts a four-cone spooling machine 31 in the initial phase of the segment integration process. Four supporting structures (e.g. 30a, 30b, 30c and 30d) are shown, with each of the supporting structures oriented in a spaced radial arrangement about spooling machine rotational axis 33 with the small ends of the supporting structures adjacent rotational axis 33. Free ends 26 of segments 24a, 24b, 24c, and 24d are initially aligned with respective supportive structures 30 to ensure that "spooling" of the membrane segment will start in a desirable place and under the desirable conditions. The initial adhesion of free ends 26 to the exterior surfaces of the hollow cone-shaped supporting structures can be initiated by the electrostatic attraction between these two members. In the preferred embodiment, the supporting structures are made from pure fused quartz.

Main cone-shaped heaters (not shown) are disposed within the interior cavity of each of the cone-shaped supporting structures 30a, 30b, 30c and 30d, respectively. The main heaters provide an even temperature along the exterior surface of the cone-shaped supporting structures 30. The supporting structures 30a–30d and their main heaters are each rotated in direction A about longitudinal axes 35a, 35b, 35c and 35d, respectively, while segments 24a, 24b, 24c, and 24d are simultaneously rotated in direction B about rotational axis 33 of the spooling machine, thereby resulting in the transferring or spooling of the corresponding segments 24 onto the exterior surfaces of the cone-shaped supporting structures 30. During this procedure, the supporting bridges 28 (FIG. 1) of the membrane 20 are removed by a laser beam, a high current electron beam, or by some other conventional means that disengages the segments from the membrane during the spooling process.

The level of strain that a thin single crystalline membrane experiences during transferring onto the cone-shaped supporting structure depends upon the amount of mechanical deformation introduced to the silicon membrane during spooling. Lattice strain is a function of two variables—the radius of curvature of the exterior surface of the supporting structure and membrane thickness. Under some critical conditions, excessive energy is released by formation of dislocations. In the case of a silicon membrane which has germanium atoms embedded therein and which has been bonded to a cone-shaped supporting structure, this excessive energy can be consumed by formation of a lattice with larger local interatomic spacing, e.g. a spacing characteristic to germanium. Under these conditions, dislocations will not be introduced while both the germanium and silicon atoms are under compressive strain. Increased surface energy also can facilitate segregation of germanium atoms into lines, and under certain conditions, into quantum wires along predefined directions and with a predefined density. Strain typically increases as the length of the radius of curvature of the supporting structure is reduced, and as the thickness of the membrane increases. Additionally, germanium introduction into the silicon lattice can relieve this strain up to a point when the alloy contains 100% germanium and 0% silicon.

If deposited evenly in a very thin layer 44 on top of the silicon membrane 20 prior to spooling, germanium atoms will tend to migrate toward the locations of the membrane with maximum surface energy in order to minimize the energy. This migration can be assisted and enhanced by elevated temperatures provided by both main heaters and supplemental heaters 40a, 40b, 40c and 40d (FIG. 3). The rate of germanium migration and diffusion into the silicon lattice also can be controlled by an uneven temperature field with higher temperature being applied where a greater migration rate is desired.

Figures 4A, 4B:
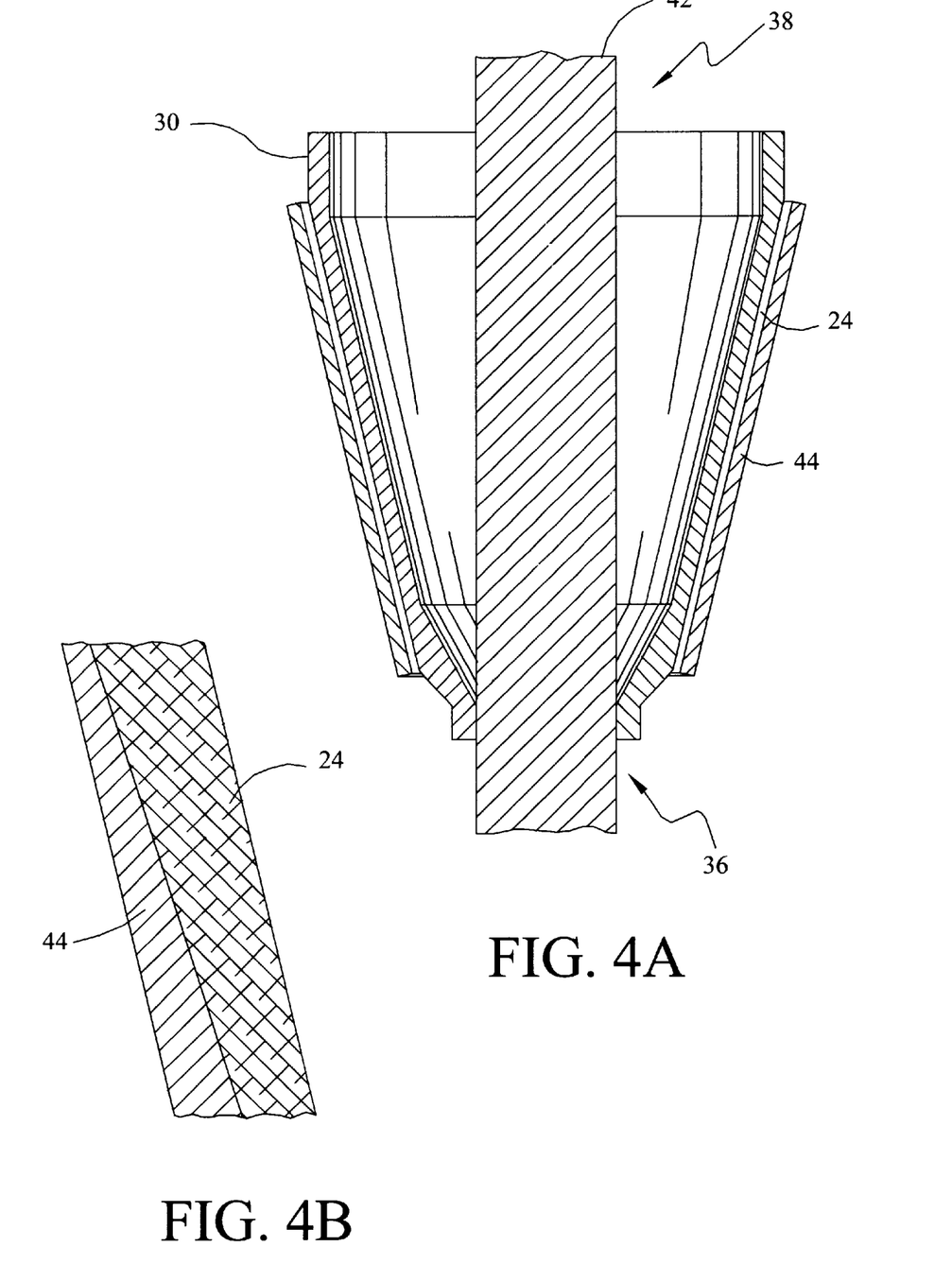
FIG. 4A illustrates a first method of controlling germanium diffusion into a bent silicon membrane according to a preferred embodiment of the present invention.
FIG. 4B illustrate second method of controlling germanium diffusion into a bent silicon membrane facilitating the formation of germanium quantum wires according to a preferred embodiment of the present invention.

As shown in FIG. 4A, an uneven temperature field can be obtained by inserting cylindrical heater 42 into the interior of the cone-shaped supporting structure 30 after a membrane has been bonded thereto. The structure 30 and, in turn, membrane 20, will be exposed to a maximum temperature at the small end 36 of the structure, where the structure has a smaller interior diameter and its interior surface is located closer to the heater 42. This is also the area where the silicon membrane experiences the maximum strain. The large end 38 of the structure is exposed to the lowest temperature, where the least amount of lattice strain occurs and the radius of curvature of the structure is the greatest. The surface energy and temperature controlled motion of germanium atoms across the surface of the stressed silicon membrane provides the conditions for autoselective diffusion of the germanium atoms. This autoselective process prevents dislocations from being introduced, while maintaining the silicon-germanium bonds under compressive strain. As shown in FIG. 4B, and as a result of being exposed to the elevated temperatures, an $Si_xGe_{1-x}$ alloy, where X decreases from the large end 38 to the small end 36, is formed in the surface layer of the film.

During the spooling process, surface temperature of the supporting structure is maintained below the level where appreciable diffusion can occur, this temperature is maintained by the main cone-shaped heater located inside a supporting structure 30. Supplemental heaters 40 provide an additional thermal flow across the area of the membrane 20 that is located directly between the main and supplemental heaters. This additional thermal flow elevates the surface temperature of the membrane 20 exactly at the location of initial bending of the membrane where the strain to a silicon lattice is initially introduced. This locally elevated temperature facilitates both germanium diffusion into the silicon lattice at this location as well as speeds up the migration of germanium atoms predeposited onto the surface of the membrane, and yet weakly attached to it. At this elevated temperature, germanium atoms start moving across the surface of the silicon lattice toward the locations with higher surface energy in order to minimize it. Formation of the SiGe alloy and germanium quantum wires on the surface of the silicon membrane naturally force the membrane to bend around the curved exterior of the supporting structure, thereby preventing relaxation of the membrane by the introduction of dislocations while maintaining both the silicon lattice and the quantum wires under compressive strain.

After segments 24 of the segmented silicon membrane 20 are transferred onto the exterior surface of the supporting structures 30, the material of the membrane with or without the germanium quantum wires may be bonded to the supporting structure 30 by the means of one of two following procedures.

Figure 5:
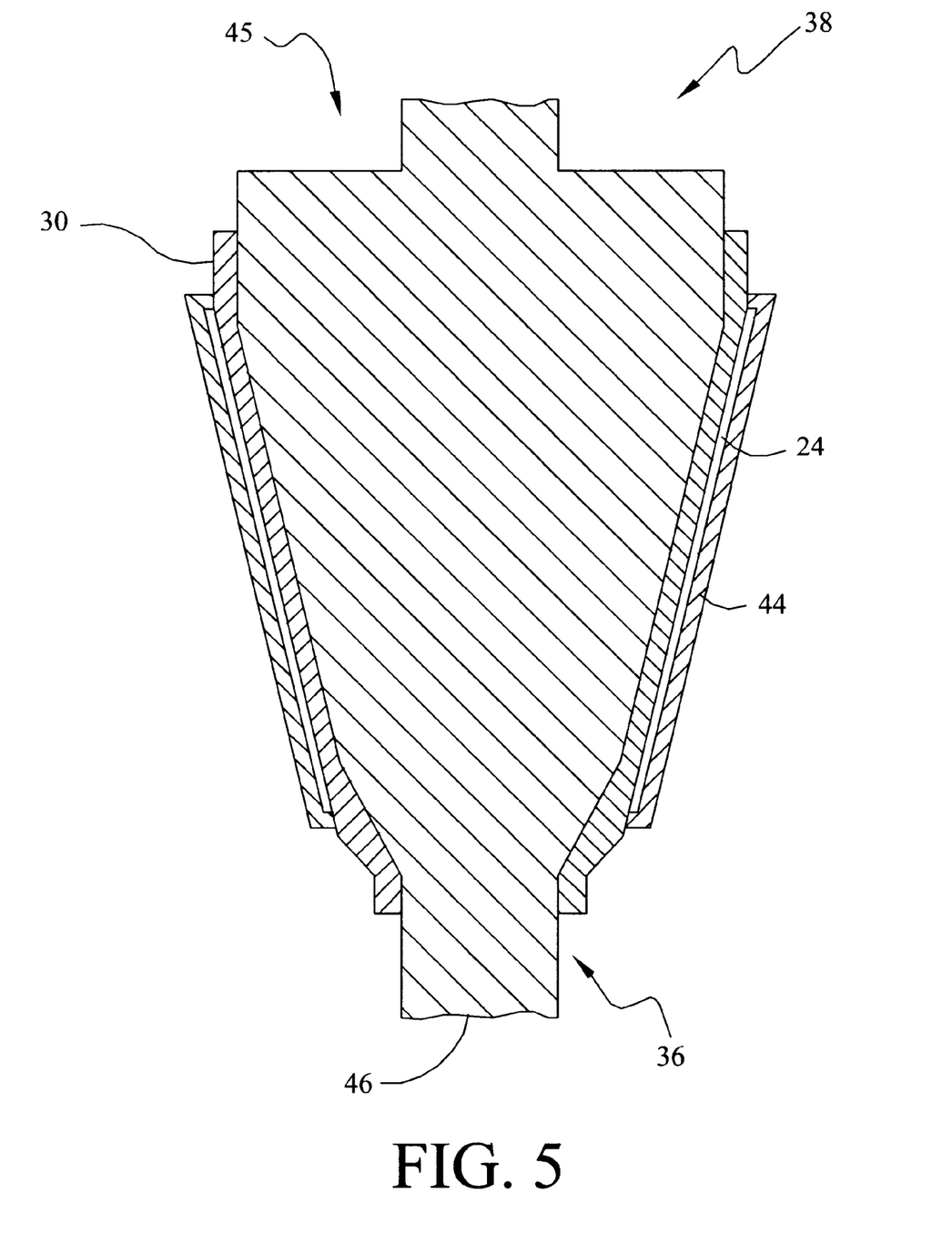
FIG. 5 illustrates a first method for bonding a silicon membrane to a non-planar supporting structure according to a preferred embodiment of the present invention.

FIG. 5 illustrates a first bonding method which typically is executed after the spooling of segments 24 of the membrane 20 onto a quartz supporting structures 30. This method requires that the segments 24 of the membrane 20 be spooled onto the surface of the supporting structure 30 in an oxygen containing atmosphere. As a result of processing the supporting structure in this manner, oxygen is trapped in voids between membrane 20 and the exterior surface 41 of the quartz supporting structure. After a segment of the membrane is spooled onto the supporting structure, as described hereinabove, a layer of polysilicon 44 is deposited over the segment 24, creating a thin shell around the supporting structure-membrane assembly 45 and encapsulating the segment between the cone-shaped quartz surface 41 and the polysilicon shell. Next, a cone-shaped heater 46 is inserted into the interior of the supporting structure 30. Because of the unique interior-conforming shape of the heater 46, temperature at the small end 36 of the structure is higher than at the large end 38. The entire supporting structure-membrane assembly 45 is then placed into an oxygen atmosphere where the heater 46 is activated. Heating the assembly 45 within the oxygen environment causes the polysilicon shell to oxidize and expand, thereby urging the single-crystal silicon membrane segment 24 toward the exterior surface 41 of the quartz supporting structure 30. Since the oxygen trapped in voids between the membrane segment 24 and the quartz surface 41 is utilized during the oxidation of the interior surface of the membrane segment, pressure in the voids drops and silicon oxide fills the voids. Consequently, the membrane segment 24 fuses with the quartz surface 41 of the supporting structure even at areas which were previously occupied by voids. The external silicon dioxide layer is then etched off.

Figure 6:
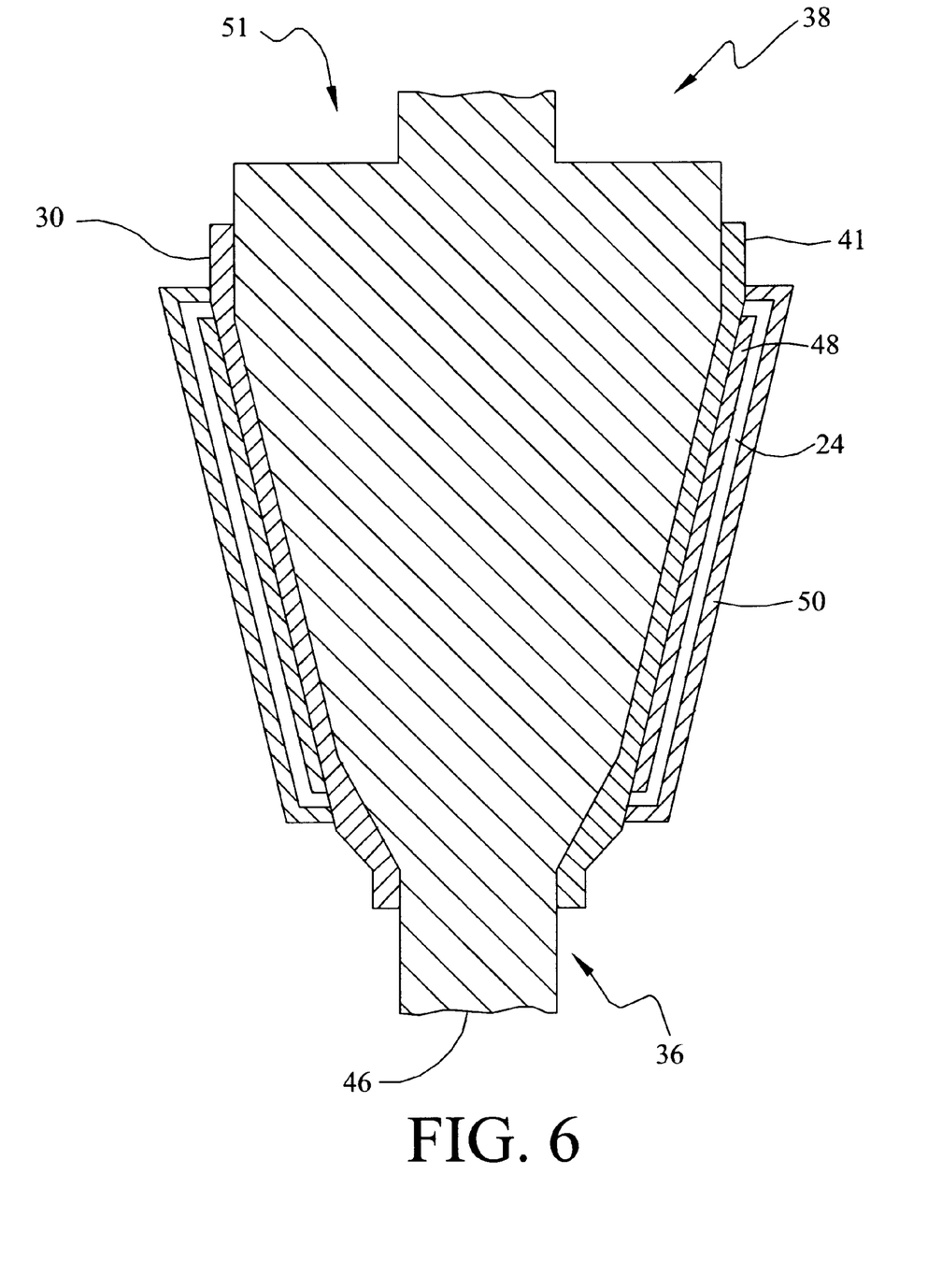
FIG. 6 illustrates a second method for bonding a silicon membrane to a non-planar supporting structure according to a preferred embodiment of the present invention.

A second bonding method is illustrated in FIG. 6, whereby segments 24 of the silicon membrane 20 are spooled onto the quartz supporting structure 30 in an oxygen free environment. According to the second method, a first polysilicon layer 48 is deposited onto the exterior surface 49 of the supporting structure 30 prior to spooling of the segments 24. After spooling, a second layer 50 of polysilicon is deposited over of the segment 24, thereby creating a supporting structure-membrane assembly 51. A cone-shaped heater 46 is then placed into the interior of the supporting structure.

The assembly 51 is then placed into an oxygen environment for oxidation as described hereinabove. The heat applied by the heater melts the inner polysilicon layer 48, and also assists in oxidizing the outer polysilicon layer 50. Because of the thermal gradient across the four layers, e.g. support structure 30, inner polysilicon layer 48, segment 24 and outer polysilicon layer 50, the temperature of the outer layer 50 is lower than the temperature of the inner layer 48. As the assembly 51 is heated, oxidation of the outer polysilicon layer 50 causes it to expand, creating force against the underlying membrane. Further heating of the assembly melts the inner polysilicon layer 48 that is in contact with the quartz supporting structure 30. Once the melting point of the polysilicon layer 48 is achieved, heat is removed, thereby allowing the molten silicon to recrystallize. The molten polysilicon layer 48 then recrystallizes using the inner surface of the single-crystal silicon segment 24 as a seed, thereby enabling the molten silicon to replicate the crystalline structure of the segment. Additionally, the silicon fuses with the quartz cone-shaped supporting structure 30. The external silicon dioxide layer is then etched off.

Therefore, flat silicon membranes can be integrated with a non-planar supporting structures and bonded thereto utilizing the aforementioned germanium segregation method for conforming the membrane to a supporting structure. A high quality bond between the silicon membrane and the material of the non-planar supporting structure can be achieved by utilizing the expansion of silicon dioxide during its formation on the curved surface as a result of polysilicon oxidation.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method of fabricating a semiconductor element assembly comprising the steps of:

segmenting a unitary wafer of semiconductor material into a plurality of semi-attached wafer segments, each of said serni-attached wafer segments being attached by a wafer bridge to an adjacent one of said wafer segments;

aligning a supporting structure with each of said wafer segments;

detaching each of said wafer segments from each other by severing each of said wafer bridges, and;

bonding each of said wafer segments to one of said supporting structures.

2. The method of claim 1, wherein the step of bonding includes applying heat to each of said supporting structures for adhering said wafer segments to said supporting structures.

3. The method of claim 1, wherein each of said supporting structures includes a non-planar exterior surface, and wherein the step of bonding includes rotating each of said supporting structures relative to each of said wafer segments such that each of said segments align with and engage one of said supporting structures.

4. The method of claim 3, wherein each of said wafer segments is rotated about a rotational axis while each of said supporting structures is rotated about its longitudinal axis such that each of said segments align with and engage one of said supporting structures.

5. The method of claim 1, wherein said semiconductor wafer is a silicon membrane having a characteristic lattice constant and each of said supporting structures includes a non-planar exterior surface, and further including the step of relieving stress of said lattice such that each of said segments deforms to engage with one of said supporting structures.

6. The method of claim 5, further including depositing a layer of polysilicon onto said silicon membrane prior to the step of detaching.

7. The method of claim 5, wherein the step of relieving stress comprises depositing Germanium atoms onto said silicon membrane prior to the step of detaching.

8. The method of claim 7, wherein said silicon membrane is maintained at a temperature no greater than approximately 440 degrees centigrade.

9. The method of claim 8, wherein the temperature of said silicon membrane is elevated above approximately 440 degrees centigrade during the step of bonding such that Germanium atoms are diffused into said lattice.

10. The method of claim 1, wherein the step of bonding occurs in an oxygen containing atmosphere.

11. The method of claim 10, wherein the step of bonding includes depositing a first layer of polysilicon onto each of said wafer segments.

12. The method of claim 11, further including the step of heating each of said supporting structures after the step of depositing said first layer of polysilicon.

13. The method of claim 12, further including the step of oxidizing said first layer of polysilicon.

14. The method of claim 13, further including the step of removing the first layer of polysilicon after said first layer has oxidized.

15. The method of claim 1, wherein each of said supporting structures has a first layer of polysilicon formed thereon prior to the step of bonding.

16. The method of claim 15, wherein said segmented wafer segments are bonded to said supporting structures in an oxidant free atmosphere.

17. The method of claim 16, wherein the step of bonding includes depositing a second layer of polysilicon onto each of said wafer segments such that each of said, wafer segments is disposed between said first and second layers of polysilicon.

18. The method of claim 17, further including the step of heating each of said supporting structures after the step of depositing said first layer of polysilicon.

19. The method of fabrication of claim 18, wherein the step of heating is continued until said first layer of polysilicon melts.

20. The method of claim 19, further including the step of allowing said first polysilicon layer to recrystalize, and then removing said second layer of polysilicon.

* * * * *